United States Patent
Kim et al.

(10) Patent No.: US 9,048,839 B2
(45) Date of Patent: Jun. 2, 2015

(54) 2-TERMINAL SWITCHING DEVICE

(71) Applicants: Kyung-min Kim, Goyang-si (KR); Young-bae Kim, Seoul (KR); Eun-ju Cho, Yecheon-gun (KR)

(72) Inventors: Kyung-min Kim, Goyang-si (KR); Young-bae Kim, Seoul (KR); Eun-ju Cho, Yecheon-gun (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 72 days.

(21) Appl. No.: 13/905,706

(22) Filed: May 30, 2013

(65) Prior Publication Data

US 2014/0091856 A1   Apr. 3, 2014

(30) Foreign Application Priority Data

Sep. 28, 2012 (KR) .................... 10-2012-0109283

(51) Int. Cl.
*G11C 11/00* (2006.01)
*H03K 17/70* (2006.01)

(52) U.S. Cl.
CPC .................................... *H03K 17/70* (2013.01)

(58) Field of Classification Search
USPC ......... 365/46, 55, 74, 97, 100, 131, 148, 158, 365/171, 173, 163
See application file for complete search history.

(56) References Cited

U.S. PATENT DOCUMENTS

| | | | |
|---|---|---|---|
| 7,902,857 B1 | 3/2011 | Pino | |
| 8,081,129 B1 | 12/2011 | Santori et al. | |
| 2009/0231910 A1* | 9/2009 | Liu et al. | 365/163 |
| 2011/0002157 A1* | 1/2011 | Shimomura et al. | 365/148 |
| 2011/0285309 A1 | 11/2011 | Van De Ven | |
| 2012/0014169 A1 | 1/2012 | Snider | |
| 2012/0127780 A1 | 5/2012 | Strachan et al. | |

* cited by examiner

*Primary Examiner* — Fernando Hidalgo
(74) *Attorney, Agent, or Firm* — Harness, Dickey & Pierce, P.L.C.

(57) ABSTRACT

A two-terminal switching device includes a resistive switching element, a diode, and a resistive circuit. The resistive switching element switches between low and high resistance states based on a switching signal and maintain a switched resistance state until another switching signal is received. The diode is connected to the resistive switching element and blocks the switching signal from being transmitted to an output terminal. The resistive circuit allows the switching signal blocked by the diode to flow to the reference potential.

21 Claims, 4 Drawing Sheets

2-TERMINAL SWITCHING DEVICE

CROSS-REFERENCE TO RELATED APPLICATIONS

This application claims the benefit of Korean Patent Application No. 10-2012-0109283, filed on Sep. 28, 2012, in the Korean Intellectual Property Office, the disclosure of which is incorporated herein in its entirety by reference.

BACKGROUND

1. Field

The present disclosure relates to a switching device.

2. Description of the Related Art

Switching elements are switched into different states to perform a variety of functions depending on the application. One type of switching element is a resistive switching element having non-volatile characteristics. In such elements even when no external power is supplied, a state of the element is not changed until a next switching operation occurs. Resistive switching elements may be made easily by a simple thin-film forming process implementing. In addition, resistive switching elements may be made in a form of 3-dimensional (3D) stack for small size. Based on these characteristics, resistive switching elements are used in various applications such as resistive random access memories (RRAMs).

SUMMARY

In accordance with one or more embodiments, a 2-terminal switching device including a resistive switching element and a method for controlling the 2-terminal switching device are provided. Also, a computer readable medium is provided to store thereon a program for executing the method embodiments.

According to one embodiment, a 2-terminal switching device includes a first terminal to which a switching signal and a main signal are applied; a resistive switching element which is coupled to the first terminal, is switched into a low resistance state or a high resistance state according to a switching signal, and maintains a switched resistance state until another switching signal is received; a second terminal which outputs the main signal applied to the first terminal when the resistive switching element is in the low resistance state; a diode disposed between the resistive switching element and the second terminal and blocks the switching signal from being transmitted to the second terminal; and a resistive circuit disposed between a node between the resistive switching element and the diode and a reference potential and allows the switching signal blocked by the diode to flow into the reference potential.

According to another embodiment, a switching system includes a controller which applies a main signal and a switching signal to a switching device, and a switching device which is switched into an on state or an off state according to the switching signal and outputs the main signal or blocks the main signal from being output, according to the switched state of the switching device. The switching device includes a resistive switching element which is switched into a low resistance state or a high resistance state according to a switching signal and maintains a switched resistance state until another switching signal is received; a diode which is coupled to the resistive switching element and blocks the switching signal from being output; and a resistive circuit which is disposed between a node and a reference potential and allows the switching signal blocked by the diode to flow into the reference potential.

According to another embodiment, a method of controlling a 2-terminal switching device, the 2-terminal switching device including a resistive switching element which is switched into a low resistance state or a high resistance state according to a switching signal and maintains a switched resistance state until another switching signal is received, a diode which is coupled to the resistive switching element, and a resistive circuit which is disposed between a node between the resistive switching element and the diode and a reference potential, includes controlling the 2-terminal switching device by applying a switching signal having a negative voltage to the 2-terminal switching device so that the resistance state of the resistive switching element is switched and then the switching signal is not output and by applying a main signal having a positive voltage to the 2-terminal switching device so that the resistance state of the resistive switching element is not switched and the main signal is output.

According to another embodiment, a computer-readable recording medium having recorded thereon a program for executing the method for controlling a 2-terminal switching device.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
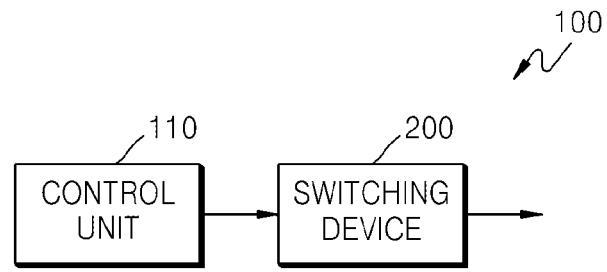
FIG. 1 is a block diagram of one embodiment of a switching system that uses a 2-terminal switching device.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

In the drawings, it is understood that the thicknesses of layers and regions may be exaggerated for clarity. It will also be understood that when a layer is referred to as being "on" another layer or substrate, it can be directly on the other layer or substrate or intervening layers may also be present. Like reference numerals in the drawings denote like elements, and thus their description will not be repeated. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing particular embodiments only and is not intended to be limiting of example embodiments. As used herein, the singular forms "a", an and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram of one embodiment of a switching system 100 that includes a control unit 110 and a switching device 200. FIG. 1 illustrates only components of the switching system 100 that are associated with the present embodiment. Accordingly, it will be understood by one of ordinary skill in the art to which the present embodiment pertains that the switching system 100 may further include general-use components other than the components illustrated in FIG. 1.

The control unit 110 applies a main signal and a switching signal to the switching device 200. In accordance with one embodiment, the control unit 110 outputs the main signal and the switching signal to the switching device 200 via a single control line. In another embodiment, these signals may be output through different signal lines.

The switching signal is applied to switch the switching device 200 between on and off states. The switching signal may only be used to switch the switching device 200 between these states and may not be output via an output terminal of the switching device 200. In other embodiments, the switching signal may control the states of other switches or circuit elements.

The main signal may be applied to a controlled circuit or controlled device that the control unit 110 wants to control, and is output or blocked from being output depending on an on or off state of the switching device 200. At this time, the switching state of the switching device 200 may not be changed by the main signal. Accordingly, even when the switching device 200 is a 2-terminal switching device, the switching device 200 may be controlled to distinguish between the switching signal and the main signal.

For example, the switching signal may be set to have a negative voltage and the main signal may be set to have a positive voltage. Thus, the resistance state of a resistive switching element for switching the switching device 200 into an on or off state may be set to be switched only at a negative voltage, so that the switching state of the switching device 200 is not changed by a main signal having a positive voltage.

In addition, the switching device 200 may allow only a signal having a positive voltage to be output via the output terminal when the switching device 200 is in an on state, so that a switching signal having a negative voltage is not output via the output terminal.

The control unit 110 may distinguish a switching signal for switching the state of the switching device 200 from a main signal which is to be output, by controlling the magnitudes and/or polarities of the voltages, or both, of the switching signal and the main signal. The operation of the control unit 110 will be described in detail after an operation of the switching device 200 is described.

The control unit 110 may be or may include at least one processor. Accordingly, it will be understood by one of ordinary skill in the art to which the present embodiment pertains that the control unit 110 may be included in a general-use computer system and driven.

The switching device 200 is switched into an on state or an off state according to the switching signal, and outputs the main signal or blocks the main signal from being output, according to the switched state of the switching device 200. The switching device 200 is switched into an on state or an off state by using the resistive switching characteristics of the resistive switching element.

Accordingly, when the resistance state of the resistive switching element is switched from a low resistance state to a high resistance state, the switching device 200 is switched into an off state. When the resistance state of the resistive switching element is switched from the high resistance state to the low resistance state, the switching device 200 is switched into an on state.

Accordingly, when the resistive switching element is switched into the high resistance state and the switching device 200 is in an off state, the switching device 200 does not output main signals. When the resistive switching element is switched into the low resistance state and the switching device 200 is in an on state, the switching device 200 outputs a main signal. In this case, the switching state of the switching device 200, namely, the resistance state of the resistive switching element, is switched according to the switching signal.

According to an embodiment, the switching device 200 may include a resistive switching element, a diode, and a resistive element. In this case, the resistive switching element is switched into a low resistance state or a high resistance state according to a first switching signal, and has resistive switching characteristics where a switched resistance state is not changed until a second switching signal is received. The resistive switching element may have non-volatile characteristics where, even when no external power is supplied, a state of the resistive switching element is not changed until next switching operation occurs.

When a voltage of a certain magnitude or higher is applied with the resistive switching element in a high resistance state, the resistive switching element is switched from the high resistance state to a low resistance state. The voltage to switch the resistive switching element from a high resistance state to a low resistance state may be referred to as a set threshold voltage. Similarly, when a voltage of a certain magnitude or higher is applied with the resistive switching element in a low resistance state, the resistive switching element is switched from the low resistance state to a high resistance state. When the resistive switching element is switched from the low resistance state to the high resistance state, the voltage may be referred to as a reset threshold voltage.

In accordance with one embodiment, the switching device 200 may use a unipolar resistive switching element that enables both set switching (in which a resistive switching element is switched from a high resistance state to a low resistance state) and reset switching (in which a resistive switching element is switched from a low resistance state to a high resistance state) by a voltage having one polarity. In other embodiments, a multi-polar resistive switching element may be used.

Also, according to an embodiment, the switching device 200 uses a resistive switching element formed of a material that enables switching between a low resistance state and a high resistance state only when a voltage of a negative polarity is applied and that inhibits resistance state switching when a voltage of a positive polarity is applied. As a result of using such a material, the switching state of the switching device 200 is not changed even when a main signal having a positive voltage is applied.

According to another embodiment, the switching device 200 may use a resistive switching element formed of a material that enables switching between a low resistance state and a high resistance state even when a voltage having only one of a negative polarity or a positive polarity is applied. In this case, a main signal having a positive voltage may be set to have a voltage less than a first positive voltage at which the resistive switching element is switched from a low resistance state to a high resistance state, so that the switching state of the switching device 200 is not changed even when the main signal is applied.

By using the above-described resistive switching characteristics of a resistive switching element, even when the switching device 200 receives a switching signal and a main signal via a single input terminal, the switching signal functions to switch the switching device 200 between on and off states, and is not output via the output terminal. Also, the main signal does not change the switching state of the switching device 200.

According to the above-described embodiments, the control unit 110 controls one or both of the magnitudes and polarities of the voltages of a switching signal for switching the state of the switching device 200 and a main signal which is to be output, in order to distinguish the switching signal from the main signal. Accordingly, the switching state of the switching device 200 is not changed by a voltage of a positive polarity but is changed only by a voltage of a negative polarity.

Therefore, the switching device 200 is switched from an on state into an off state according to a third switching signal having a voltage less than or equal to a third negative voltage, and is switched from an off state into an on state according to a fourth switching signal having a voltage less than or equal to a fourth negative voltage.

The third negative voltage may correspond to a reset threshold voltage at a negative polarity, and the fourth negative voltage may correspond to a set threshold voltage at a negative polarity. In other words, the resistive switching element is switched from a low resistance state to a high resistance state according to the third switching signal and thus the switching device 200 is switched off. The resistive switching element is switched from a high resistance state to a low resistance state according to the fourth switching signal and thus the switching device 200 is switched on.

As described above, the control unit 110 controls one or both of the magnitudes and polarities of the voltages of the main signal and the switching signal. For example, the control unit 110 may apply a switching signal having a negative voltage to the switching device 200 to control the resistance state of the resistive switching element to be switched and then to control the switching signal not to be output. The control unit 110 may apply a main signal having a positive voltage to the switching device 200 to control the resistance state of the resistive switching element not to be switched and to control the main signal to be output. According to an embodiment, the control unit 110 may control a main signal to be applied having a voltage less than a first positive voltage, at which the resistive switching element is switched from a low resistance state to a high resistance state.

The control unit 110 may apply the third switching signal so that the resistive switching element is switched from a low resistance state to a high resistance state and thus the switching device 200 is switched off, or may apply the fourth switching signal so that the resistive switching element is switched from a high resistance state to a low resistance state and thus the switching device 200 is switched on. The control unit 110 may control the switching device 200 including a resistive switching element, a diode, and a resistive element, according to the above-described controlling methods.

According to an embodiment, the controlling methods performed by the control unit 110 can be written as one or more computer programs and can be implemented, for example, in general-use digital computers that execute the programs using a computer-readable recording medium. Alternatively, the one or more programs may be executed by a special-purpose computer or other programmable device including but not limited to microcontrollers and programmable array devices as well as other processing circuits.

A structure of the data used in the above-described controlling methods may be recorded in a computer-readable recording medium through several methods. Examples of the computer-readable recording medium include magnetic storage media (e.g., read only memory (ROM), floppy disks, hard disks, etc.), optical recording media (e.g., CD-ROMs, or DVDs), etc.

In accordance with one embodiment, the switching device 200 of FIG. 1 may be formed by stacking a transition metal oxide including at least one of a tantalum (Ta) oxide, a zirconium (Zr) oxide, a yttrium (Y) oxide, yttria-stabilized zirconia (YSZ), a titanium (Ti) oxide, a hafnium (Hf) oxide, a manganese (Mn) oxide, or a magnesium (Mg) oxide, or a mixture of these oxides. Accordingly, the switching device 200 may be easily manufactured to have a simple metal-insulator-metal structure without restrictions on a substrate and may enable 3D stacking to promote miniaturization, ease of manufacture, and/or a reduction in costs.

Figure 2:
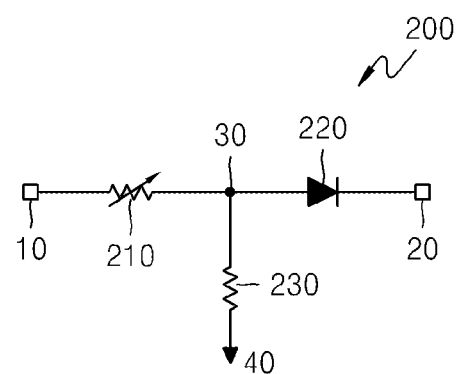
FIG. 2 is an example of a circuit diagram of the 2-terminal switching device illustrated in FIG. 1.

FIG. 2 is a circuit diagram of one embodiment of the switching device 200 illustrated in FIG. 1. Referring to FIG. 2, the switching device 200 includes a first terminal 10, a second terminal 20, a resistive switching element 210, a diode 220, and a resistor 230.

In operation, a switching signal and a main signal are applied via one terminal corresponding to the first terminal 10 of the switching device 200. The switching signal is applied to switch the switching device 200 between on and off states, and the switching signal is not output via the output terminal 20. The main signal is output or blocked from being output according to the on/off state of the switching device 200. At this time, the main signal does not change the switching state of the switching device 200. A more detailed explanation of the operation of the switching device 200 according to the main signal and the switching signal will be described in detail later with reference to FIGS. 3A and 3B.

The switching device 200 may change one or both of the magnitudes and polarities of the voltages of the main signal and the switching signal so that the switching device 200 is switched between on and off states according to only the switching signal. For example, the switching signal may have a negative voltage, and the main signal may have a positive voltage.

Also, the third switching signal that allows the switching device 200 to be switched off may be determined to have a voltage less than or equal to the third negative voltage of the resistive switching element 210, or the fourth switching signal that allows the switching device 200 to be switched on may be determined to have a voltage less than or equal to the fourth negative voltage of the resistive switching element 210. The third negative voltage corresponds to a reset threshold voltage at a negative polarity, and the fourth negative voltage corresponds to a set threshold voltage at a negative polarity.

In addition, the main signal may be determined to have a voltage less than the first positive voltage at which the resistive switching element 210 is switched from a low resistance state to a high resistance state, so that the switching state of the switching device 200 is not changed. The first positive voltage corresponds to a reset threshold voltage having a positive polarity. Accordingly, a main signal having a positive voltage may allow the switching state of the switching device 200 to be maintained, and a switching signal having a negative voltage may be controlled not to be output to the second terminal 20 of the switching device 200. Accordingly, the switching device 200 may output a switching signal for switching the state of the switching device 200 with distinguishing from a main signal which is to be output.

The magnitudes and polarities of the voltages of the switching signal and the main signal of the switching device 200 may be determined, for example, based on the operational characteristics of the resistive switching element 210. Examples of these characteristics are described with reference to FIGS. 4A and 4B.

The resistive switching element 210 is connected to the first terminal 10 and is switched into a low resistance state (LRS) or a high resistance state (HRS) according to the first switching signal, and the switched state of the resistive switching element 210 may be maintained until the second switching signal is received. The switching device 200 is switched into an on state or an off state by using the resistive switching characteristics of the resistive switching element 210.

Accordingly, when the resistance state of the resistive switching element 210 is switched from an LRS to an HRS, the switching device 200 is switched into an off state. When the resistance state of the resistive switching element 210 is switched from an HRS to an LRS, the switching device 200 is switched into an on state. The switching of the resistive switching element 210 from the LRS to the HRS may be referred to as set switching, and the switching of the resistive switching element 210 from the HRS to the LRS may be referred to as reset switching.

The resistive switching element 210 may be formed of a resistive switching material, and the resistance of the resistive switching material may vary depending on an applied voltage. In one embodiment, the resistive switching element 210 switches into the LRS or the HRS as the resistance of the resistive switching material changes. Accordingly, the resistive switching material may have low resistance values when the resistive switching element 210 is in the LRS, and has high resistance values when the resistive switching element 210 is in the HRS.

Figure 5:
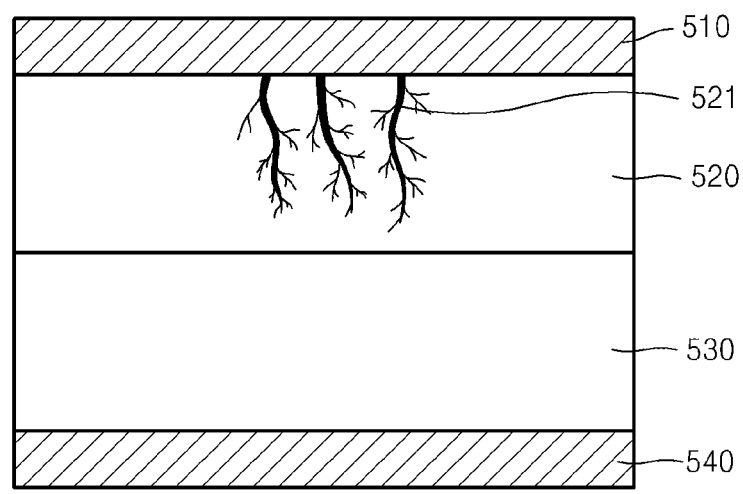
FIG. 5 shows one example of a resistive switch that may be included in the device of FIG. 2.

According to one implementation, the resistive switching element 210 may include an insulator layer formed of a transition metal oxide and a conductive layer formed of a transition metal oxide. For example, each of the transition metal oxides used to form the insulator layer and the conductive layer, respectively, may be at least one of a Ta oxide, a Zr oxide, a Y oxide, YSZ, a Ti oxide, a Hf oxide, a Mn oxide, or a Mg oxide, or a mixture of one or more of these oxides. An example of the resistive switching element 210 is shown in FIG. 5. The resistive switching element 210 may include a first electrode 510, insulator layer 520, conductive layer 530 and a second electrode 540, where the insulator layer 520 comprises at least one metal oxide as described above. By applying a voltage to the first electrode 510 or the second electrode 520, conducting path 521 corresponding to a current path is formed in the insulator layer 520.

According to an embodiment, the transition metal oxides used to form the insulator layer and the conductive layer, respectively, may be Ta2O5 and TaOx (where 0<x<2.5), respectively, but they are not limited thereto. The resistive switching element 210 may further include a buffer layer for preventing diffusion of ions, a base material layer for supplying ions, and/or an interlayer insulator layer.

When a voltage equal to or greater than a critical voltage is applied to the insulator layer of the resistive switching element 210, breakdown occurs, and a current path corresponding to a conducting path is formed in the insulator layer due to movement of oxygen vacancies and oxygen ions. Thereafter, the conducting path electro-chemically repeats creation and rupture according to the magnitude of an applied voltage. Accordingly, the resistance of the resistive switching material changes, and the resistance state of the resistive switching element 210 is switched between the LRS and the HRS.

According to an embodiment, the resistive switching element 210 may be formed of a material that enables switching between the LRS and the HRS even when a voltage having one polarity of a positive polarity or a negative polarity is applied. According to another embodiment, the resistive switching element 210 may be formed of a material that enables switching between the LRS and the HRS only when a voltage having a negative polarity is applied and that is unable to do the switching when a voltage having a positive polarity is applied.

In one embodiment, the diode 220 is serially connected between the resistive switching element 210 and the second terminal 20, and the switching signal applied to the first terminal 10 is blocked from being transmitted to the second terminal 20. When the resistive switching element 210 is in the LRS and the main signal is applied to the first terminal 10, the diode 220 may be biased forward, and thus the main signal may be output to the second terminal 20.

On the other hand, the switching signal is applied to the first terminal 10, the diode 220 may be biased backward, and thus the switching signal may be blocked from being transmitted to the second terminal 20. When the diode 220 is biased backward, the resistance of the diode 220 is set to be higher than that of the resistor 230, and thus the switching signal is blocked not to be transmitted to the second terminal 20. When the diode 220 is biased forward, the resistance of the diode 220 is set to be lower than that of the resistor 230, and thus the diode 220 outputs the main signal to the second terminal 20.

The resistor 230 is connected between a node 30 between the resistive switching element 210 and the diode 220 and a ground 40 so that the switching signal blocked by the diode 220 flows to the ground 40. In other words, when a switching signal is applied, the diode 220 is biased backward, and the resistance of the diode 220 when the diode 220 is biased backward is set to be higher than that of the resistor 230, so that the switching signal flows to the ground 40 via the resistor 230. When a main signal is applied, the diode 220 is biased forward, and the resistance of the diode 220 when the diode 220 is biased forward is set to be lower than that of the resistor 220, so that the main signal is output to the second terminal 20 via the diode 220.

When the resistive switching element 210 is in an LRS, the second terminal 20 outputs a main signal received via the first terminal 10. When the resistive switching element 210 is in an HRS, the second terminal 20 does not output the main signal received via the first terminal 10. As indicated, according to an embodiment, the switching device 200 may be formed by stacking a transition metal oxide including at least one of a Ta oxide, a Zr oxide, a Y oxide, YSZ, a Ti oxide, a Hf oxide, a Mn oxide, or a Mg oxide, or a mixture of one or more of these oxides.

Figure 3A:
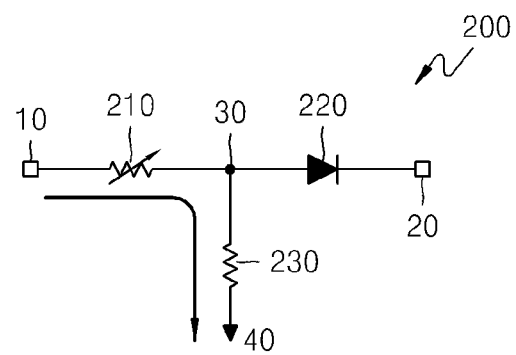
FIG. 3A is a circuit diagram for illustrating an operation of the 2-terminal switching device illustrated in FIG. 2 when a switching signal has been applied to the 2-terminal switching device.

FIG. 3A is a circuit diagram for illustrating an operation of the switching device 200 illustrated in FIG. 2 when a switching signal has been applied to the switching device 200. Explanations associated with the switching device 200 described above with reference to FIG. 2 may be applied to the switching device 200 of FIG. 3A, so a detailed description thereof will not be provided here.

Referring to FIG. 3A, when the switching signal is applied to the switching device 200 via the first terminal 10, the resistance state of the resistive switching element 210 is switched. For example, when the third switching signal having the voltage less than or equal to the third negative voltage is applied to the first terminal 10, the resistive switching element 210 is switched from the LRS to the HRS, and the switching device 200 is switched from an on state to an off state. The third negative voltage corresponds to the reset threshold voltage having a negative polarity.

When the fourth switching signal having the voltage less than or equal to the fourth negative voltage is applied to the first terminal 10, the resistive switching element 210 is switched from the HRS to the LRS, and the switching device 200 is switched from an off state to an on state. The fourth negative voltage corresponds to the set threshold voltage having a negative polarity.

When the third switching signal or the fourth switching signal is applied to the first terminal 10, the diode 220 is biased backward because the third switching signal and the fourth switching signal have negative voltages. At this time, the third switching signal or the fourth switching signal flows to the ground 40 via the resistor 230, because the resistance of the diode 220 when the diode 220 is biased backward is higher than that of the resistor 230. As such, the third switching signal or the fourth switching signal is blocked from being transmitted to the second terminal 20, by the diode 220.

Figure 3B:
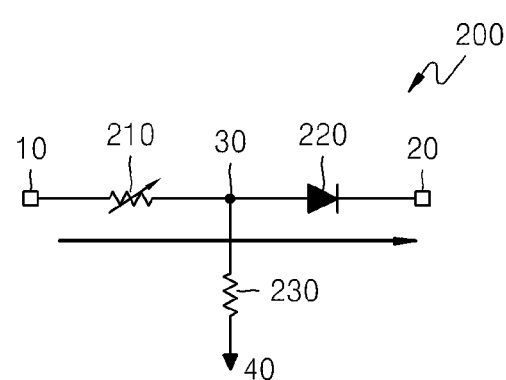
FIG. 3B is a circuit diagram for illustrating an operation of the 2-terminal switching device illustrated in FIG. 2 when a main signal has been applied to the 2-terminal switching device.

FIG. 3B is a circuit diagram for illustrating an operation of the switching device 200 illustrated in FIG. 2 when a main signal has been applied to the switching device 200. Explanations associated with the switching device 200 described above with reference to FIG. 2 may be applied to the switching device 200 of FIG. 3B, so a detailed description thereof will not be provided here.

Referring to FIG. 3B, the main signal is applied via the first terminal 10 of the switching device 200. For example, when a main signal having a positive voltage is applied to the switching device 200 via the first terminal 10, the resistance state of the resistive switching element 210 is not switched.

According to an embodiment, the switching device 200 may use the resistive switching element 210 formed of a material that enables switching between the LRS and the HRS only when a voltage having a negative polarity is applied and that is unable to do the switching when a voltage having a positive polarity is applied. Accordingly, when the main signal having a positive voltage is applied, the switching state of the switching device 200 is not changed.

According to another embodiment, the switching device 200 may use the resistive switching element 210 formed of a material that enables switching between the LRS and the HRS even when a voltage having one polarity of a positive polarity or a negative polarity is applied. In this case, the voltage less than a first positive voltage at which the resistive switching element 210 is switched from the LRS to the HRS is used as a main signal. In other words, the main signal has a voltage less than a reset threshold voltage of a positive polarity at which reset switching occurs. Accordingly, even when a main signal is applied to the switching device 200, the resistance state of the resistive switching element 210 is not switched, because the main signal has a voltage less than the reset threshold voltage or the set threshold voltage.

When the resistive switching element 210 is in the HRS, the switching device 200 is in an off state and the resistive switching element 210 has a very high resistance, and thus the main signal applied to the first terminal 10 is not output to the second terminal 20.

When the resistive switching element 210 is in the LRS and the main signal is applied to the first terminal 10, the diode 220 is biased forward, because the main signal has a positive voltage. At this time, the main signal is output to the second terminal 20 via the diode 220, because the resistance of the diode 220 when the diode 220 is biased forward is lower than that of the resistor 230. As such, the main signal applied to the first terminal 10 is output to or is not output to the second terminal 20, depending on the switching state of the switching device 200.

As such, even when the switching device 200 is a 2-terminal switching device, the switching device 200 may be controlled distinguishing between a switching signal and a main signal.

Figure 4A:
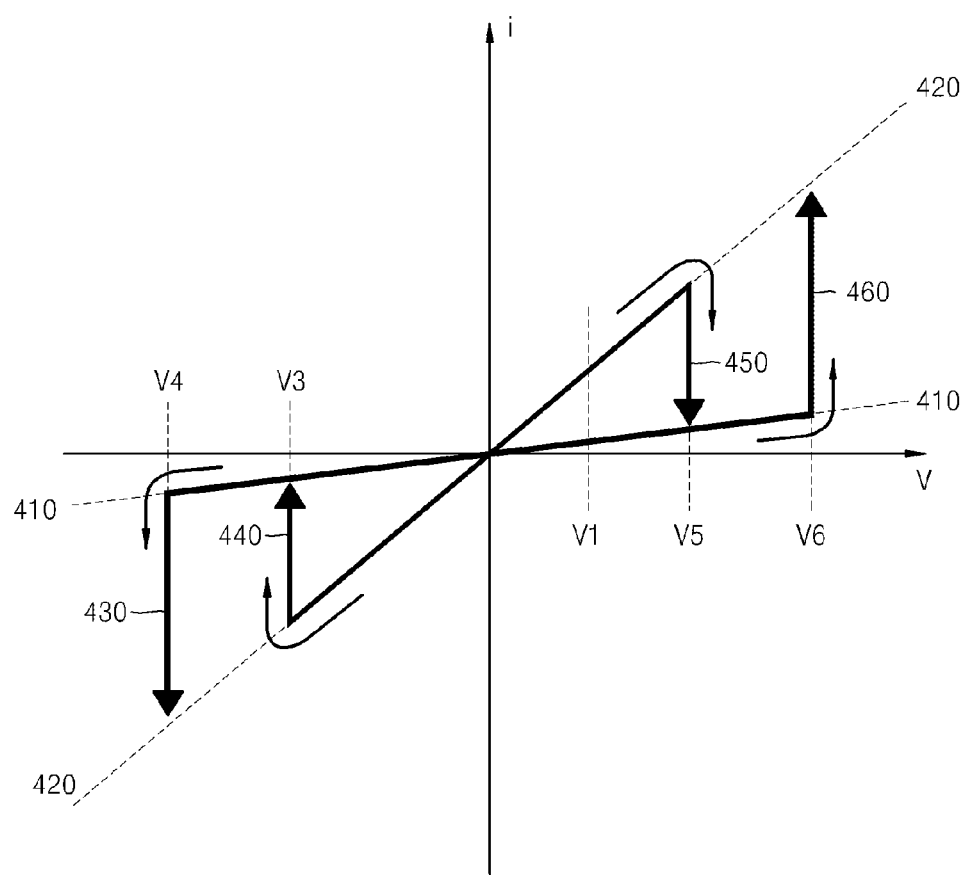
FIG. 4A is a graph showing operational characteristics of a resistive switching element which is used in a 2-terminal switching device according to one embodiment.

FIG. 4A is a graph showing operational characteristics of the resistive switching element 210 according to one embodiment. The horizontal axis indicates a voltage and the vertical axis indicates a current, curves 430, 440, 450, and 460 of show variations of the current with respect to a voltage applied to the resistive switching element 210, and the inclinations of the curves 430, 440, 450, and 460 correspond to reciprocals of the resistance values of the resistive switching element 210. Accordingly, curves 430, 440, 450, and 460 show variations of the resistance of the resistive switching element 210. Also, in FIG. 4A, dotted line 420 represents the LRS of the resistive switching element 210 and a dotted line 410 represents the HRS of the resistive switching element 210.

The resistive switching element 210 of FIG. 4A is formed of a material that enables switching between the LRS and the HRS even when a voltage having one polarity of a positive polarity or a negative polarity is applied.

When a voltage less than or equal to a third negative voltage V3 is applied to the resistive switching element 210 in the LRS, the resistance value of the resistive switching element 210 in the LRS increases to the resistance value of the resistive switching element 210 in the HRS. Accordingly, the resistive switching element 210 is switched into an HRS and the switching device 200 is switched into an off state. In other words, reset switching occurs in which the resistive switching element 210 is switched from the HRS to the LRS at a voltage less than or equal to the third negative voltage V3. In this case, the third negative voltage V3 corresponds to a reset threshold voltage of a negative polarity.

When a voltage less than or equal to a fourth negative voltage V4 is applied to the resistive switching element 210 in the HRS, the resistance value of the resistive switching element 210 in the HRS decreases to the resistance value of the resistive switching element 210 in the LRS. Accordingly, the resistive switching element 210 is switched into an LRS and the switching device 200 is switched into an on state. In other words, set switching occurs in which the resistive switching element 210 is switched from the HRS to the LRS at the voltage less than or equal to the fourth negative voltage V4. In this case, the fourth negative voltage V4 corresponds to a set threshold voltage of a negative polarity.

When a voltage equal to or greater than a fifth positive voltage V5 is applied to the resistive switching element 210 in the LRS, the resistance value of the resistive switching element 210 in the LRS increases to the resistance value of the resistive switching element 210 in the HRS. Accordingly, the resistive switching element 210 is switched into an HRS and the switching device 200 is switched into an off state. In other words, reset switching occurs in which the resistive switching element 210 is switched from the HRS to the LRS at the voltage equal to or greater than the fifth positive voltage V5. The fifth positive voltage V5 corresponds to a reset threshold voltage having a positive polarity.

When a voltage equal to or greater than a sixth positive voltage V6 is applied to the resistive switching element 210 in the HRS, the resistance value of the resistive switching element 210 in the HRS decreases to the resistance value of the resistive switching element 210 in the LRS. Accordingly, the resistive switching element 210 is switched into an LRS and the switching device 200 is switched into an on state. In other words, set switching occurs in which the resistive switching element 210 is switched from the HRS to the LRS at the voltage equal to or greater than the sixth positive voltage V6. In this case, the sixth positive voltage V6 corresponds to a set threshold voltage of a positive polarity.

At this time, a first positive voltage V1 less than the fifth positive voltage V5 at which the resistive switching element 210 is switched from the LRS to the HRS is used as a main signal and thus the main signal applied to the first terminal 10 does not switch the resistance state of the resistive switching element 210. In other words, a voltage of the main signal may be the first positive voltage V1 less than the fifth voltage V5, which is a reset threshold voltage of a positive polarity at which reset switching occurs. Accordingly, even when the main signal is applied to the switching device 200, the resistance state of the resistive switching element 210 is not switched, because the main signal has a voltage less than the fifth voltage V5, which is the reset threshold voltage, or the sixth voltage V6, which is a set threshold voltage.

A voltage less than the third voltage V3, which is a reset threshold voltage of a negative polarity at which reset switching occurs, may be used as the third switching signal that allows the switching device 200 to be switched into an off state. A voltage less than the fourth voltage V4, which is a set threshold voltage of a negative polarity at which set switching occurs, may be used as the fourth switching signal that allows the switching device 200 to be switched into an on state. Accordingly, a main signal having a positive voltage does not change the switching state of the switching device 200. Accordingly, a switching signal for switching the state of the switching device 200 is distinguished from a main signal which is to be output.

Figure 4B:
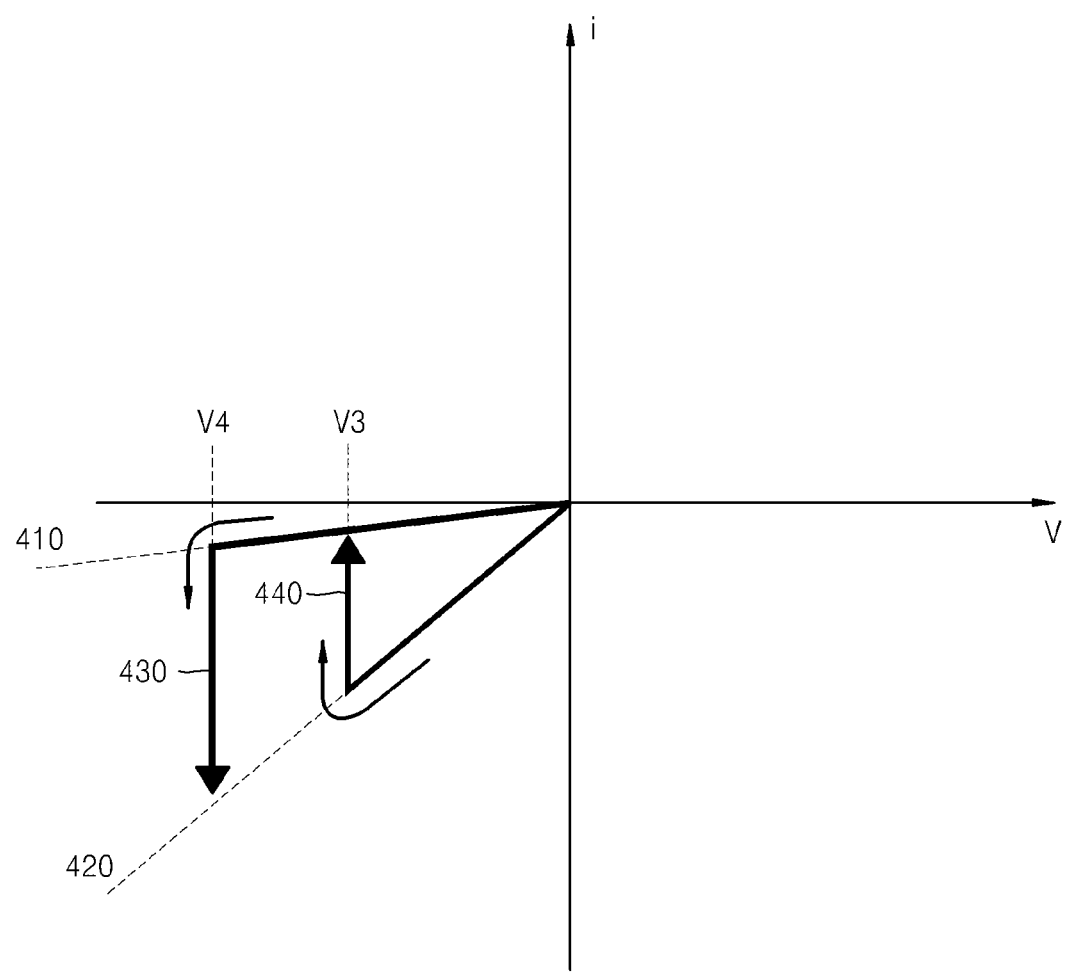
FIG. 4B is a graph showing operational characteristics of a resistive switching element which is used in a 2-terminal switching device according to another embodiment.

FIG. 4B is a graph showing operational characteristics of the resistive switching element 210 according to another embodiment. The horizontal axis indicates a voltage and the vertical axis indicates a current. Accordingly, curves 430 and 440 of FIG. 4B show variations of the current with respect to a voltage applied to the resistive switching element 210, and the inclinations of curves 430 and 440 correspond to reciprocals of the resistance values of the resistive switching element 210. Accordingly, curves 430 and 440 show variations in the resistance of the resistive switching element 210. Also, in FIG. 4B, a dotted line 420 represents an LRS of the resistive switching element 210 and a dotted line 410 represents an HRS of the resistive switching element 210.

The resistive switching element 210 of FIG. 4B is formed of a material that enables switching between the LRS and the HRS only when a voltage having a negative polarity is applied and that is unable to do the switching when a voltage having a positive polarity is applied.

When a voltage less than or equal to the third negative voltage V3 is applied to the resistive switching element 210 in the LRS, the resistance value of the resistive switching element 210 in the LRS increases to the resistance value of the resistive switching element 210 in the HRS. Accordingly, the resistive switching element 210 is switched into an HRS and the switching device 200 is switched into an off state. In other words, reset switching occurs in which the resistive switching element 210 is switched from the HRS to the LRS at a voltage less than or equal to the third negative voltage V3. In this case, the third negative voltage V3 corresponds to a reset threshold voltage of a negative polarity.

When a voltage less than or equal to a fourth negative voltage V4 is applied to the resistive switching element 210 in the HRS, the resistance value of the resistive switching element 210 in the HRS decreases to the resistance value of the resistive switching element 210 in the LRS. Accordingly, the resistive switching element 210 is switched into an LRS and the switching device 200 is switched into an on state. In other words, set switching occurs in which the resistive switching element 210 is switched from the HRS to the LRS at the voltage less than or equal to the fourth negative voltage V4. In this case, the fourth negative voltage V4 corresponds to a set threshold voltage of a negative polarity.

At this time, a positive voltage is used as a main signal and thus the main signal applied to the first terminal 10 does not switch the resistance state of the resistive switching element 210.

A voltage less than the third voltage V3, which is the reset threshold voltage of a negative polarity at which reset switching occurs, may be used as the third switching signal that allows the switching device 200 to be switched into an off state. A voltage less than the fourth voltage V4, which is the set threshold voltage of a negative polarity at which set switching occurs, may be used as the fourth switching signal that allows the switching device 200 to be switched into an on state.

Accordingly, a switching signal for switching the state of the switching device 200 is distinguished from a main signal which is to be output.

Also, a 2-terminal switching device may be provided and controlled to distinguish between a switching signal and a main signal using the resistive switching element. The resistive switching element may be easily manufactured to have a simple metal-insulator-metal structure without restrictions on a substrate and may enable 3D stacking, and thus a compact 2-terminal switching device may be easily manufactured at low costs.

Moreover, the resistive switching element has non-volatile characteristics where, even when no external power is supplied, a switched state of the resistive switching element is maintained. Therefore, the 2-terminal switching device is better than existing 3-terminal switches in terms of size miniaturization, manufacturing, costs, and performance.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A two-terminal switching device comprising:
a first terminal configured to receive a switching signal and a main signal;
a resistive switching element coupled to the first terminal and configured to switch into a low resistance state or a high resistance state according to the switching signal and to maintain a switched resistance state until another switching signal is received;
a second terminal configured to output the main signal received by the first terminal when the resistive switching element is in the low resistance state;
a diode disposed between the resistive switching element and second terminal and configured to block the switching signal from being transmitted to the second terminal; and
a resistive circuit disposed between a node and a reference potential and configured to allow the switching signal blocked by the diode to flow to the reference potential, the node between the resistive switching element and the diode,
wherein the resistive switching element switches
from the low resistance state to the high resistance state at a voltage less than or equal to a first negative voltage, and
from the high resistance state to the low resistance state at a voltage less than or equal to a second negative voltage.

2. The switching device of claim 1, wherein
the switching signal has a negative voltage, and
the main signal has a positive voltage.

3. The switching device of claim 1, wherein the second terminal does not output the main signal received by the first terminal when the resistive switching element is in the high resistance state.

4. The switching device of claim 1, wherein the resistive switching element and the diode are provided in series between the first and second terminals and care configured to block transmission of the main signal to the second terminal when the resistive switching element is in the high resistance state, and are configured to transfer the main signal from the first terminal to the second terminal when the resistive switching element is in the low resistance state.

5. The switching device of claim 2, wherein the resistive switching element switches from the low resistance state to the high resistance state at a first positive voltage, and
the main signal is less than the first positive voltage.

6. The switching device of claim 1, wherein
when the diode is biased backward, a resistance of the diode is greater than a resistance of the resistive circuit, and
when the diode is biased forward, the resistance of the diode is smaller than the resistance of the resistive circuit.

7. The switching device of claim 1, wherein
when the resistive switching element is in the low resistance state and the first terminal receives the main signal, the diode is biased forward and the main signal is transferred to the second terminal.

8. The switching device of claim 1, wherein
when the first terminal receives the first switching signal, the diode is biased backward and the first switching signal is blocked from being transferred to the second terminal.

9. The switching device of claim 1, further comprising:
a control unit configured to control at least one of magnitudes and polarities of voltages of the main signal and the switching signal
such that the switching signal selectively enables transmission of the main signal, which is to be applied to the first terminal, through the resistive switching element.

10. The switching device of claim 1, wherein the resistive switching element is formed of a material that performs bidirectional switching between the high resistance state and the low resistance state in one polarity.

11. The switching device of claim 1, wherein
the resistive switching element is formed of a material that switches between the high resistance state and the low resistance state in a negative polarity, and
the material does not switch between the high resistance state and the low resistance state in a positive polarity.

12. The switching device of claim 1, wherein the resistive switching element is formed by stacking a transition metal oxide.

13. The switching device of claim 12, wherein the transition metal oxide includes one or more of a tantalum (Ta) oxide, a zirconium (Zr) oxide, a yttrium (Y) oxide, yttria-stabilized zirconia (YSZ), a titanium (Ti) oxide, a hafnium (Hf) oxide, a manganese (Mn) oxide, or a magnesium (Mg) oxide.

14. The switching device of claim 1, wherein the resistive switching element comprises
an insulator layer formed of a transition metal oxide; and
a conductive layer formed of a transition metal oxide, wherein the resistive switching element switches states between the high resistance state and the low resistance state based on repetition of creation and rupture of a conducting path in the insulator layer, the repetition of creation and rupture of the conducting path based on a voltage received by the resistive switching element.

15. A switching system comprising:
a controller configured to output a main signal and a switching signal; and
a switching device configured to switch into an on state or an off state according to the switching signal and output or block the main signal according to the switched state of the switching device, the switching device comprising
   a resistive switching element configured to switch between a low resistance state and a high resistance state according to the switching signal and to maintain a switched resistance state until another switching signal is received;
   a diode coupled to the resistive switching element and configured to block the switching signal from being output; and
   a resistive circuit disposed between a node and a reference potential and configured to allow the switching signal blocked by the diode to flow into the reference potential, the node between the resistive switching element and the diode,
wherein the resistive switching element switches
   from the low resistance state to the high resistance state at a voltage less than or equal to a first negative voltage, and
   from the high resistance state to the low resistance state at a voltage less than or equal to a second negative voltage.

16. The switching system of claim 15, wherein
the switching signal has a negative voltage, and
the main signal has a positive voltage.

17. The switching system of claim 15, wherein
the resistive switching element is configured to switch from the low resistance state to the high resistance state at a first positive voltage, and the main signal is less than the first positive voltage.

18. A method of controlling a switching device including a resistive switching element configured to switch between a low resistance state and a high resistance state according to a switching signal and to maintain a switched resistance state until another switching signal is received, a diode which is coupled to the resistive switching element, and a resistive circuit disposed between a node, between the resistive switching element and the diode, and a reference potential, the method comprising:
   applying the switching signal having a negative voltage to an input terminal of the switching device to switch the resistance state of the resistive switching element, the switching signal being an enabling signal to enable the transmission of a main signal; and
   applying the main signal having a positive voltage to the input terminal of the switching device,
   wherein the resistive switching element and the diode are provided in series and are configured to selectively output the main signal to the output terminal of the switching device depending on the resistance state of the resistive switching element,
   wherein the negative voltage of the switching signal blocks output of the switching signal to an output terminal of the switching device after the resistance state is switched by the switching signal, and
   wherein the positive voltage of the main signal allows the main signal not to change the resistance state of the resistive switching element.

19. The method of claim 18, wherein the resistive switching element switches from the low resistance state to the high resistance state at a first positive voltage, and
the main signal is less than a first positive voltage.

20. The method of claim 18, wherein the resistive switching element switches from the low resistance state to the high resistance state based on a third switching signal, the third switching signal having a voltage less than or equal to a first negative voltage, and
   the resistive switching element switches from the low resistance state to the high resistance state based on a fourth switching signal, the fourth switching signal having a voltage less than or equal to a second negative voltage.

21. A computer-readable recording medium having recorded thereon a computer program for executing the method of claim 18.

* * * * *